United States Patent [19]

Nasu et al.

[11] Patent Number: 4,804,888
[45] Date of Patent: Feb. 14, 1989

[54] LOW STARTING VOLTAGE SHORT-ARC DISCHARGE LAMP

[75] Inventors: Shoichi Nasu; Yasuo Onishi, both of Himeji, Japan

[73] Assignee: Ushio Denki Kabushiki Kaisha, Tokyo, Japan

[21] Appl. No.: 111,272

[22] Filed: Oct. 22, 1987

[51] Int. Cl.$^4$ ........................ H01J 61/54; H01J 61/06
[52] U.S. Cl. ...................................... 313/595; 313/631
[58] Field of Search ............................. 313/631, 595

[56] References Cited

U.S. PATENT DOCUMENTS 3,488,546 1/1970 Paquette .................. 313/631 X

Primary Examiner—David K. Moore
Assistant Examiner—K. Wieder
Attorney, Agent, or Firm—Robert F. Ziems

[57] ABSTRACT

A short-arc discharge lamp includes a combination of electrodes arranged in an opposing relation in a discharge space surrounded by silica glass. An expansion and contraction member made of a shape-memory alloy, which contracts at high temperatures, is fixed on one of the electrodes. A lighting start-up discharge terminal is formed at a free end of the expansion and contraction member. A free end of the lighting start-up discharge terminal is in contact with the other electrode at room temperature but is separated from the other electrode at high temperatures.

7 Claims, 1 Drawing Sheet

LOW STARTING VOLTAGE SHORT-ARC DISCHARGE LAMP

BACKGROUND OF THE INVENTION (1) Field of the Invention

This invention relates to a short-arc discharge lamp, and more specifically to a short-arc discharge lamp which does not require a high start-up voltage upon lighting.

(2) Description of the Prior Art

Short-arc discharge lamps such as xenon lamps and mercury-vapor lamps are used widely as light sources in luminaire, projection equipment, optical equipment and various industrial applications such as exposure apparatus for the fabrication of semiconductors. Whichever field a short-arc discharge lamp is used in, it has been indispensable for the start-up of the short-arc discharge lamp to apply a start-up voltage, which is much higher than that required to maintain an arc discharge, across both electrodes so as to develop a dielectric breakdown therebetween. A lighting start-up high voltage generator has hence been needed in order to produce such a high voltage. A lighting device for such a short-arc discharge lamp has therefore been large so that its manufacturing cost has been high.

SUMMARY OF THE INVENTION

An object of this invention is therefore to provide a short-arc discharge lamp, which can be lit without need for an application of a high start-up voltage and hence without any high voltage generator for starting up lighting so that its lighting device is reduced in both size and manufacturing cost.

In one aspect of this invention, there is thus provided a short-arc discharge lamp which comprises a combination of electrodes arranged in an opposing relation in a discharge space surrounded by silica glass. An expansion and contraction member made of a shape-memory alloy, which contracts at high temperatures, is fixed on one of the electrodes. A lighting start-up discharge terminal is formed at a free end of the expansion and contraction member. A free end of the lighting start-up discharge terminal is in contact with the other electrode at room temperature but is separated from the other electrode at high temperatures.

Owing to the above-described construction, the short-arc discharge lamp of this invention can be started up by a low voltage, for example, by simply applying an arc-maintaining voltage. Its lighting can therefore be started by a simple structure without need for any lighting start-up high-voltage generator. A smaller lighting device can thus be used, leading to a short-arc discharge lamp of a lower manufacturing cost.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE INVENTION AND PREFERRED EMBODIMENTS

Figure 1:
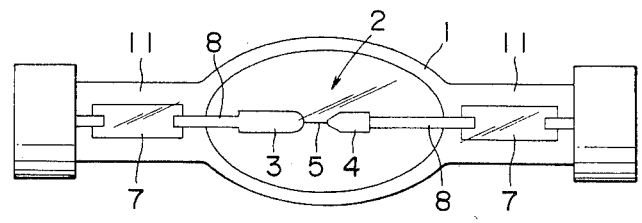
FIG. 1 is a front see-through view of a short-arc discharge lamp according to one embodiment of this invention.

Referring first to FIG. 1, the short-arc discharge lamp is a xenon short-arc discharge lamp according to the present invention. A silica glass envelop 1 centrally includes a prolate ellipsoidal portion, which internally defines a discharge space 2. Press-sealed portions 11,11 are formed on both sides of the prolate ellipsoidal portion. Inside the press-sealed portions 11,11, molybdenum foils 7,7 are sealed respectively. Electrode stems 8,8 are connected at their respective distal ends to the corresponding molybdenum foils 7,7. Proximal end portions of the electrode stems 8,8 extend into the space 2. An anode 3 and cathode 4 are provided in a mutually-opposing relation at proximal free ends of the respective electrode stems 8,8.

Figure 2A:
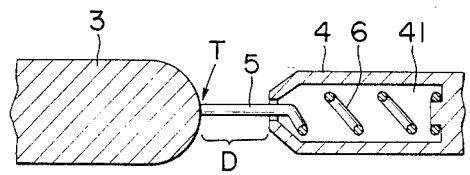
FIGS. 2(A) through 2(C) schematically illustrate the process of lighting of the short-arc discharge lamp in different stages.
Figure 2B:
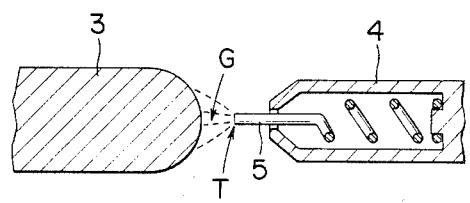
Figure 2C:
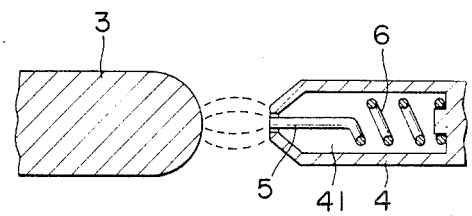

As shown in FIGS. 2(A) through 2(C), the cathode 4 is in the shape of a tube, which terminates in a truncated conical free end portion, and defines a hollow space 41 internally. An expansion and contraction member 6 is fixed at one end thereof on the bottom wall of the hollow space 41. The expansion and contraction member 6 is in a helical shape and is made of a shape-memory alloy. The longitudinal axis of the expansion and contraction member 6 is coincident with the direction in which the anode 3 and cathode 4 oppose to each other. At room temperature, the expansion and contraction member 6 is in a state expanded in the direction of its central axis [FIG. 2(A)]. A lighting start-up discharge terminal 5 formed of a thorium-containing tungsten rod is attached to the free end of the expansion and contraction member 6. While the short-arc discharge lamp is not lit, in other words, at room temperature, the free end T of the lighting start-up discharge terminal 5 is in contact with the free end of the anode 3 as depicted in FIG. 2(A). At high temperatures during lighting of the short-arc discharge lamp, the expansion and contraction member 6 is allowed to contract so that the lighting start-up discharge terminal 5 is retreated inside the hollow space 41.

In order to light the short-arc discharge lamp of the above-described construction, a lighting-maintaining voltage is applied across both electrodes 3,4. At this time, the expansion and contraction member 6 is at room temperature and is hence in an expanded state. Since the free end T of the lighting start-up discharge terminal 5 is in contact with the anode 3, a current is allowed to flow through the expansion and contraction member 6 formed of the shape-memory alloy. As a result, the temperature of the expansion and contraction member 6 rises owing to resistance heating. The expansion and contraction member 6 therefore begins to contract to form a gap G between the anode 3 and the free end T of the lighting start-up discharge terminal 5 as shown in FIG. 2(B). At first, since this gap G is narrow, discharge of an arc begins to take place between the anode 3 and the free end T of the lighting start-up discharge terminal 5 although the voltage applied across the electrodes 3,4 are is low. Through this stage, the expansion member 6 undergoes a still greater degree of contraction so that the gap G between the anode 3 and the free end T of the lighting start-up discharge terminal 5 widens. As the gap G becomes wider, a longer arc is discharged. Eventually, the lighting start-up discharge terminal 5 is retreated fully within the hollow space 41 as illustrated in FIG. 2(C). In this state, a discharge starts between the anode 3 and cathode 4, namely, across the discharge gap to establish a normal lighting state. Through the process described above, the discharge lamp is started.

Since the short-arc discharge lamp of this invention can be started up by simply applying a low voltage as described above, it does not require any lighting start-up high-voltage generator and its lighting device can be simplified to a significant extent. When the short-arc discharge lamp is turned off, its temperature drops. The expansion and contraction member 6 thus expands so that the free end of the lighting start-up discharge terminal 5 is again brought into contact with the anode 3 so as to permit the start-up of the short-arc discharge lamp again in the above process.

In the above-described embodiment, it is not essential for the voltage, which is applied initially across the electrodes 3,4, to be equal to the voltage applied to maintain an arc. The former voltage may be either higher or lower than the latter voltage. It is however necessary that a voltage is applied at a level sufficient to develop an arc across the gap G formed when the lighting start-up discharge terminal 5, which has been in contact with the anode 3, is separated from the anode 3.

Figure 3:
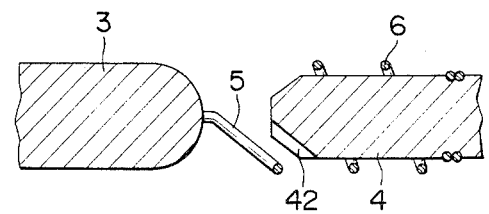
FIG. 3 is a fragmentary schematic view of an short-arc discharge lamp according to another embodiment of this invention.

The expansion and contraction member 6 is arranged within the hollow space 41 of the cathode 6 in the embodiment described above. Various modifications are however feasible with respect to the arrangement of the expansion and contraction member 6, including provision of the expansion and contraction member 6 on the outer circumferential wall of the cathode 4 as depicted in FIG. 3. Designated at numeral 42 in FIG. 3 is a groove in which the lighting start-up discharge terminal 5 is received when the expansion and contraction member 6 is retreated. Further, it is optional which one of the electrodes the expansion and contraction member is provided on. Similar results can also be brought about when the expansion and contraction member 6 is provided on the anode 3.

Having now fully described the invention, it will be apparent to one of ordinary skill in the art that many changes and modifications can be made thereto without departing from the spirit or scope of the invention as set forth herein.

We claim:

1. In a short-arc discharge lamp comprising a combination of electrodes arranged in a fixed and opposing relation in a discharge space surrounded by silica glass, the improvement wherein an expansion and contraction member made of a shape-memory alloy which contracts at high temperatures is fixed on one of the electrodes, a lighting start-up discharge terminal is formed at a free end of the expansion and contraction member, and a free end of the lighting start-up discharge terminal is in contact with the other electrode at room temperature but is separated from the other electrode at high temperatures.

2. The short-arc discharge lamp as claimed in claim 1, wherein the expansion and contraction member is in a helical shape and the longitudinal axis of the expansion and contraction member is coincident with a direction in Which both electrodes oppose to each other.

3. The short-arc discharge lamp as claimed in claim 2, wherein the free end of the lighting start-up discharge terminal does not project out from the free end of said one of the electrodes at high temperatures.

4. In a short-arc discharge lamp comprising a combination of electrodes arranged in opposing relation in a discharge space surrounded by silica glass, the improvement wherein an expansion and contraction member made of a shape-memory alloy which contracts at high temperatures is fixed on one of the electrodes, a lighting start-up discharge terminal is formed at a free end of the expansion and contribution member, and a free end of the lighting start-up discharge terminal is in contact with the other electrode at room temperature but is separated from the other electrode at high temperatures, wherein the expansion and contraction member is in a helical shape and the longitudinal axis of the expansion and contraction member is coincident with a direction in which both electrodes oppose to each other, and wherein said one of the electrodes is a tubular cathode defining a hollow space therein and the expansion and contraction member is fixed at one end thereof, which is opposite to the free and thereof, on the bottom wall of the hollow space of the cathode.

5. The short-arc discharge lamp as claimed in claim 4, wherein the lighting start-up discharge terminal is retreated within the hollow space of the cathode at high temperatures.

6. The short-arc discharge lamp as claimed in claim 2, wherein said one of the electrodes is a solid cylinder and the expansion and contraction member extends along the circumferential wall of said one of the electrodes.

7. The short-arc discharge lamp as claimed in claim 1, wherein a voltage applied upon start-up of the short-arc discharge lamp is of the same level as a voltage applied to maintain an arc.

* * * * *